(12) United States Patent
Fan et al.

(10) Patent No.: US 12,112,105 B1
(45) Date of Patent: Oct. 8, 2024

(54) SOIL-CLIMATE INTELLIGENT TYPE DETERMINING METHOD FOR RICE TARGET YIELD AND NITROGEN FERTILIZER AMOUNT

(71) Applicant: China Agricultural University, Beijing (CN)

(72) Inventors: Mingsheng Fan, Beijing (CN); Yaojun Wang, Beijing (CN); Yanan Hao, Beijing (CN); Fenglu Niu, Beijing (CN)

(73) Assignee: CHINA AGRICULTURAL UNIVERSITY, Beijing (CN)

( * ) Notice: Subject to any disclaimer, the term of this patent is extended or adjusted under 35 U.S.C. 154(b) by 0 days.

(21) Appl. No.: 18/582,309

(22) Filed: Feb. 20, 2024

(30) Foreign Application Priority Data

May 18, 2023 (CN) .......................... 202310561960.4

(51) Int. Cl.
*G06F 30/20* (2020.01)
*A01C 21/00* (2006.01)

(52) U.S. Cl.
CPC ............ *G06F 30/20* (2020.01); *A01C 21/007* (2013.01)

(58) Field of Classification Search
CPC .............................. G06F 30/20; A01C 21/007
See application file for complete search history.

(56) References Cited

U.S. PATENT DOCUMENTS

| | | | |
|---|---|---|---|
| 11,085,909 B1* | 8/2021 | Berg | G16C 60/00 |
| 11,505,778 B2* | 11/2022 | Shimodaira | C07C 227/28 |
| 11,561,214 B2* | 1/2023 | Fauvet | G01N 33/483 |
| 11,635,418 B2* | 4/2023 | Berg | G01N 35/00722 |
| | | | 701/50 |
| 2016/0360755 A1* | 12/2016 | Al Juhaiman | A01N 25/04 |

* cited by examiner

*Primary Examiner* — Shogo Sasaki
(74) *Attorney, Agent, or Firm* — Muncy, Geissler, Olds & Lowe, P.C.

(57) ABSTRACT

A soil-climate intelligent type determination method for rice target yield and nitrogen fertilizer amount includes steps: construct a basic database; obtain historical weather data from the region where the rice planting area is to be determined over the past few years, and obtain real-time GFS weather data of the region in a predicted year; obtain 100 m×100 m grid sampling point soil data and a rice field vector layer of rice planting area to be determined; obtain at least three years of nitrogen fertilizer gradient test data of the rice planting area to be determined, rice variety information and management data of each farmer in each year; obtain accurate weather data of the prediction year; prepare soil data of 100 m×100 m plot-scale; localize genetic parameters of the rice growth model DSSAT; and run the localized DSSAT model to predict the plot-scale target yield and recommend the nitrogen application amount.

4 Claims, 4 Drawing Sheets

SOIL-CLIMATE INTELLIGENT TYPE DETERMINING METHOD FOR RICE TARGET YIELD AND NITROGEN FERTILIZER AMOUNT

TECHNICAL FIELD

The invention belongs to the technical field of crop target yield and nitrogen fertilizer amount estimation, in particular relates to a soil-climate intelligent type determining method for rice target yield and nitrogen fertilizer amount.

BACKGROUND

The target yield refers to the yield per unit area that the producer expects to obtain, it needs to be determined before production. The determination of target yield is one of the key technical aspects of crop production and the first prerequisite for producers to make precise management decisions. However, as a highly complex agronomic trait, crop yield is not only affected by variety genotypes, but also related to cultivation environmental conditions and field management measures. Wherein, soil factors and climate factors are biophysical environmental conditions that affect crop yield performance. Due to the high spatiotemporal heterogeneity of soil and climatic factors, precise determination of target yields before harvest has always been a difficult problem in crop production, even under well-established conditions for specific varieties and management practices.

Rice is a main food crop, and the methods for determining the target rice yield mainly include: (1) the regional average method, that is, the average rice yield in a certain area in the past few years is used as the target yield for the next season. This method is empirical or expected; (2) According to the soil fertility level, based on the evaluation of cultivated land production potential, or based on the linear regression relationship between yield based on fertilization conditions and basic soil yield, determine the target yield of rice in the next season. This method takes into account the impact of soil fertility factors on yield, but it lacks full consideration of climatic conditions and is still semi-empirical; (3) Based on crop growth models, the target yield is determined by simulating rice yields under specific varieties, management practices and climatic soil conditions; due to crop growth model is based on principles of crop physiology and biology and can clearly explain the interaction between crop phenotypes and environmental conditions at each growth stage. Therefore, the crop model method to determine target yield is more mechanistic than other two methods mentioned above. However, the data collection and model parameter calibration to drive the model to make predictions are time-consuming and labor-intensive. In addition, when determining the target yield through the crop model method, the average weather data of the past few years is usually used as the weather data for the next season to drive the crop model. At the same time, there is a lack of small-scale precise soil data in production practice. Therefore, the crop model method has limitations in determining target yields for specific climate year patterns and small-scale plots during the rice growing season; establishing more accurate future climate scenario parameters and small-scale soil property parameters are the keys to accurately determining rice target yields.

In background of climate change, research on the application of crop growth models for crop production and model evaluation under historical climate conditions has been quite extensive and mature. However, for simulating crop production conditions under future climate scenarios, more accurate climate simulation data will effectively reduce the uncertainty of assessing the impact of climate changes on agricultural production. Most studies use the average or median value of historical weather data combined with real-time weather data. This method not only weakens the impact of extreme weather on crop growth, but also significantly changes the frequency and total amount of precipitation during the crop growing season. Studies have shown that combining real-time weather data with historical weather data to generate a long-term weather data-driven model during the crop growing season can predict yield more accurately. Therefore, the present invention will continue the idea of combining historical and actual weather data, and build a climate annual simulation system based on the WRF model to provide long-term continuous weather variables required to drive the crop growth model to predict the annual crop growth season.

At present, the most detailed national digital soil database in our country is the "1:1000000 Soil Map of the People's Republic of China" compiled and published by the National Soil Census Office in 1995. This map adopts the traditional "soil occurrence classification" system, and the basic mapping unit is subclass: total classified into 12 soil classes, 61 soil types and 227 subclasses. The database consists of two parts, soil spatial data—China's 1:1 million digitized soil map and soil attribute data; in addition, the cultivated land quality survey of the Ministry of Agriculture and Rural Affairs of the People's Republic of China has established a collection point based on at least 1 collection point per 10,000 acres of cultivated land for key soil properties and cultivated land grade maps; however, these large-scale soil property data cannot meet the accuracy requirements of plot-based yield simulation; this invention collects key soil property data through a 100 m×100 m grid, using ArcGIS Kriging interpolation and regional analysis method obtains a 100 m×100 m plot scale soil property data simulation set, which is used to provide simulation of plot yield and determination of nitrogen fertilizer dosage required for driving crop growth models.

Nitrogen fertilizer is the most important factor in determining crop yield. Real-time and on-site precise nitrogen management is the key to achieving high yield and high efficiency of rice and sustainable agricultural development. Quantification of nitrogen needs to consider the law of high-yield crop fertilizer demand, soil nitrogen supply regulation, fertilizer characteristics and seasonal utilization rate. The classic determination of total nitrogen application is calculated by the Stanford equation: total nitrogen application (kg/ha)=[nitrogen requirement for target yield (kg)−soil nitrogen supply (kg)]/seasonal utilization rate of nitrogen fertilizer (%); however, this method mainly relies on the accurate determination of the target yield, soil nitrogen supply capacity and nitrogen fertilizer utilization rate in the current season; in addition, the multi-year and multi-point nitrogen fertilizer effect curve method is also often used to determine the specific climate-soil-crop system and its regional nitrogen application rate under certain management measures. Based on the accurate simulation of the target yield of the plot by the crop model, the present invention further combines the nitrogen fertilizer effect curve of the plot, and determines the amount of nitrogen fertilizer based on the target yield of the plot by adjusting the amount of nitrogen application.

SUMMARY OF THE INVENTION

In view of the above technical problems, the purpose of the present invention is to provide a soil-climate intelligent type determination method for rice target yield and nitrogen fertilizer amount, which uses a crop growth model to integrate the climate year type simulation system and the 100 m×100 m plot-scale soil property simulation model to conduct climate-soil intelligent type rice target yield prediction and nitrogen fertilizer amount recommendation.

In order to achieve the above purpose, the present invention provides the following technical solutions:

A soil-climate intelligent type determining method for rice target yield and nitrogen fertilizer amount, wherein the method includes the following steps:

S1. basic database construction;

S1.1. Obtain historical weather data from the region where the rice planting area is to be determined over the past few years, and obtain real-time GFS weather data for the region in the predicted year; Said weather data includes daily maximum temperature, daily minimum temperature, daily sunshine hours, daily precipitation, humidity, wind direction and cloud thickness;

S1.2. Obtain soil data and rice field vector layers of 100 m×100 m grid sampling points in the rice planting area to be determined; Said soil data includes soil pH, soil organic matter, soil total nitrogen, soil available phosphorus, soil available potassium, soil bulk density, soil texture, soil moisture, soil cation exchange capacity, soil nitrate nitrogen and soil ammonium nitrogen;

S1.3. Obtain at least three years of nitrogen fertilizer gradient test data, rice variety information and management data for each farmer in each year in the rice planting area to be determined;

Said nitrogen fertilizer gradient test data includes the flowering period, maturity period time and yield of rice under different nitrogen fertilizer dosage gradients, as well as aboveground biomass, leaf area index, grain weight, chlorophyll content under different nitrogen fertilizer dosage gradients and during the key growth period of rice; wherein, the nitrogen fertilizer gradient is: no nitrogen treatment, 50% of the local recommended nitrogen application amount, the local recommended nitrogen application amount and 150% of the local recommended nitrogen application amount, respectively recorded as N0, N1, N2, N3; the amount of phosphorus and potassium fertilizers of each nitrogen fertilizer gradient is the local recommended amount of phosphorus and potassium.

Said key growth periods of rice are: tillering stage, panicle initiation stage, stem elongation stage, heading stage, 20 days after heading and maturity stage; Said management data includes land plots information, agricultural operation information, fertilization information and environmental information;

S2. Obtain accurate weather data for the predicted year; According to the historical weather data of the past years in the region where the rice planting area to be determined is located and the predicted year GFS weather data of the area obtained in step S1, use the climate year type simulation system to obtain accurate weather data in the predicted year;

Said climate year type simulation system includes a WRY weather forecast model and a weather forecast model based on the LSTM deep learning method;

S3. 100 m×100 m plot-scale soil data preparation;

Each soil property of the soil data of the 100 m×100 m grid sampling point in the rice planting area is interpolated separately to obtain a 100 m×100 m soil property interpolation map, and then combined with the rice field vector layer to conduct regional analysis and processing of each soil property interpolation map to obtained 100 m×100 m plot-scale soil property map; finally integrate and output the 100 m×100 m plot-scale soil data of the rice planting area to be determined;

S4. Localization of genetic parameters of the rice growth model DSSAT model; The nitrogen fertilizer gradient test data, rice variety information and management data of the rice planting area to be determined for at least 3 years obtained in step S1, the next few months accurate forecast weather data of the rice planting area to be determined from current month of the predicted year to December of the predicted year obtained in step S2, and the 100 m×100 m plot-scale soil data of the rice planting area to be determined obtained in step S3, are input into the DSSAT model, and the genetic parameters of the model are continuously adjusted through DSSAT-GLUE and trial-and-error methods to approximate the actual measured values, the genetic parameters at this time are localized genetic parameters, and the DSSAT model at this time is the localized model;

S5. Run the localized DSSAT model to predict the plot-scale target yield and recommend nitrogen application amount;

Again, the rice variety information and management data of the rice planting area to be determined obtained in step S1, the accurate forecast weather data of the next few months from the current month of the prediction year to December of the prediction year in the rice planting area to be determined obtained in step S2 and the 100 m×100 m plot-scale soil data of the rice planting area to be determined obtained in step S3 is input into the localized DSSAT model in step S4 to obtain the potential yield prediction results of the rice planting area to be determined. 85% of the potential yield is the target yield for each plot; on this basis, the nitrogen application amount of the DSSAT model is adjusted through gradient until the nitrogen application amount increases but the potential yield no longer increases. Accordingly, the nitrogen fertilizer effect curve of each plot is established, to further determine the corresponding nitrogen application amount under the target yield. The amount is the recommended nitrogen application amount for each plot.

Said step S2 comprises:

S2.1. Input the predicted year GFS weather data of the rice planting area to be determined obtained in step S1 into the WRY weather forecast model, to obtain short-term accurate forecast weather data for next half month of the rice planting area to be determined;

S2.2. Input the historical weather data of the past years in the region where the rice planting area to be determined is located into weather forecast model based on deep learning methods such as LSTM and other, to obtain the long-term forecast weather data of next months from current month of the prediction year to December of the prediction year of the rice planting area to be determined;

S2.3. Input the short-term accurate forecast weather data obtained in step S2.1 into the weather forecast model based on LSTM and other deep learning methods in step S2.2, with the continuous update of GFS weather data in the predicted year, the long-term forecast weather data of the undetermined rice planting area output by the weather forecast model based on LSTM and other deep learning methods is continuously accurate, so as to obtain the accurate forecast weather data in the next few months from the current month of the predicted year to December of the predicted year of the undetermined rice planting area.

In said step S3, respectively use the Kriging interpolation tool and the regional analysis tool of the ArcGIS software to conduct the interpolation operation and the regional analysis processing.

In said step S4, the coefficient of determination $R^2$, the normalized root mean square error nRMSE and the average error E between agronomic parameters of the above-ground biomass, leaf area index, grain weight and chlorophyll content predicted by the model after adjusting the genetic parameters and the actual measured values are used as evaluation indicator. Until $R^2$ reaches more than 85% and nRMSE is less than 15%, the model parameter adjustment is completed and the model is localized. Wherein, the average error E<0 or E>0 is used to judge whether the model underestimates or overestimates the above agronomic parameters;

$$E = \sum (y_i - x_i)/n$$

$$R^2 = \frac{\sum (y_i - \overline{y})^2}{\sum (x_i - \overline{y})^2}$$

$$nRMSE = 100 \times \frac{\sqrt{(1/n)\sum (y_i - x_i)^2}}{\sum x_i/n}$$

In the formula, $y_i$ is the predicted value of agronomic parameters; $x_i$ is the actual measured value of agronomic parameters; $\overline{y}$ is the average value of the measured values $x_i$; n is the amount of samples participate in the calculation.

Compared with the prior arts, the beneficial effects of the present invention are:

This invention constructs a climate year-type simulation and a 100 m×100 m plot-scale soil property simulation data set, further combines the variety data and management data to run the localized DSSAT model to simulate crop growth, and obtains a "soil-climate" intelligent type plot-scale target yields and recommended nitrogen amount. Compared with the traditional use of historical annual average weather data and large-scale soil property data as input parameters, this invention significantly improves the accuracy of the target yield of the plots and the recommended amount of nitrogen fertilizer.

DETAILED DESCRIPTION OF EMBODIMENTS

Figure 1:
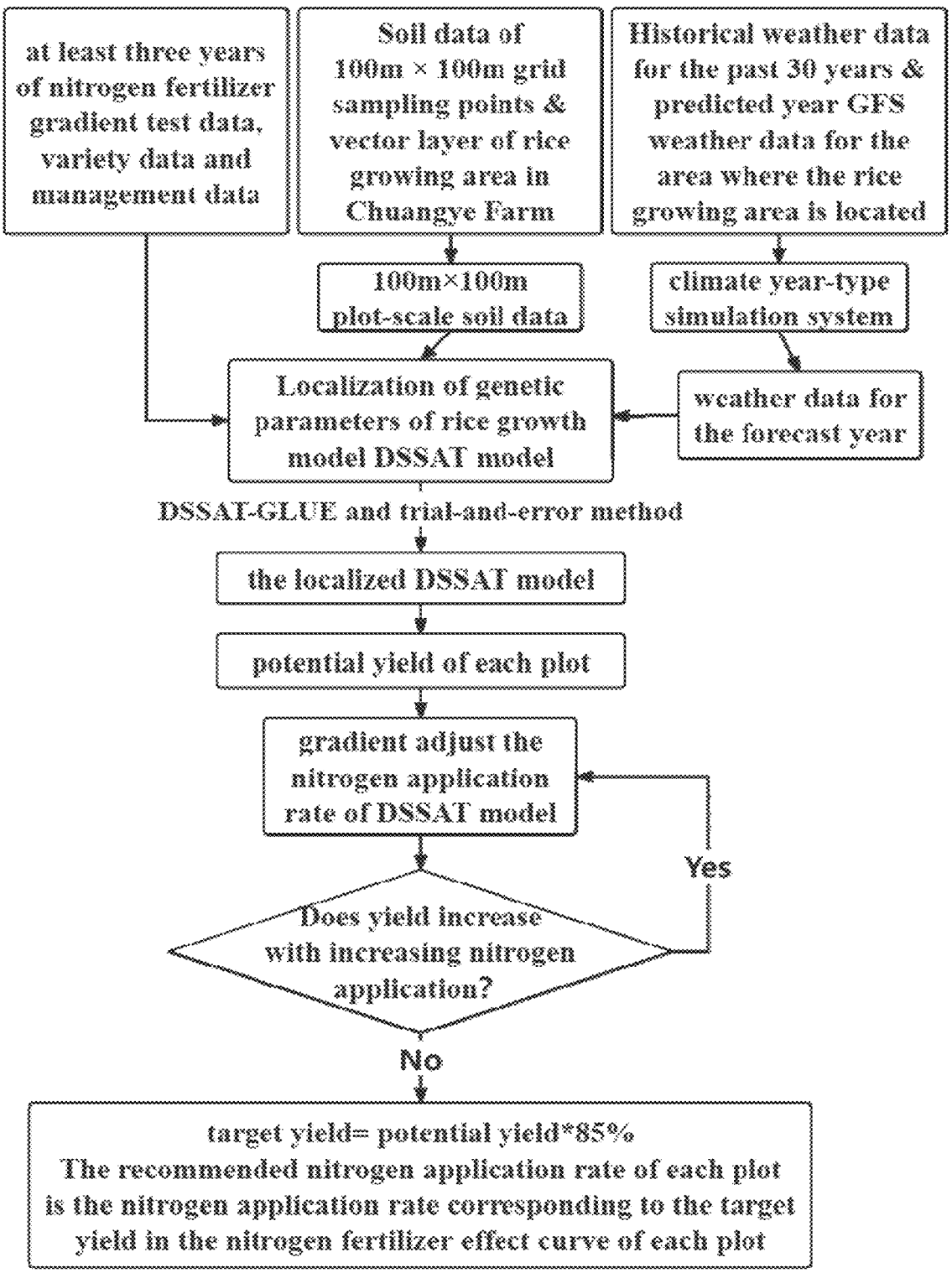
FIG. 1 is a flow chart of a method for determining rice target yield and nitrogen fertilizer amount according to an embodiment of the present invention.

The present invention will be further described below in conjunction with the accompanying drawings and examples.

A soil-climate intelligent type determination method for rice target yield and nitrogen fertilizer amount of the present invention includes the following steps:

S1. Basic database construction;

S1.1. Obtain historical weather data from the region where the rice planting area is to be determined over the past few years, and obtain real-time GFS weather data for the region in the predicted year;

The weather data include daily maximum temperature, daily minimum temperature, daily sunshine hours, daily precipitation, humidity, wind direction and cloud layer thickness;

S1.2. Obtain the soil data of the 100 m×100 m grid sampling points and the rice field vector layer in the rice planting area to be determined;

Said soil data includes soil pH, soil organic matter, soil total nitrogen, soil available phosphorus, soil available potassium, soil bulk density, soil texture, soil moisture, soil cation exchange capacity, soil nitrate nitrogen and soil ammonium nitrogen.

S1.3. Obtain the nitrogen fertilizer gradient test data for at least three years in the rice planting area to be determined, the rice variety information and management data of each farmer in each year;

Said nitrogen fertilizer gradient test data includes the flowering period, maturity period time and yield of rice under different nitrogen fertilizer amount gradients, as well as aboveground biomass, leaf area index, grain weight, chlorophyll content under different nitrogen fertilizer amount gradients and during the key growth period of rice. Wherein, the nitrogen fertilizer gradient is as follows: no nitrogen treatment, 50% of the local recommended nitrogen application amount, the local recommended nitrogen application amount and 150% of the local recommended nitrogen application amount, respectively recorded as N0, N1, N2, N3; each nitrogen fertilizer gradient dosage of phosphorus and potassium fertilizers is the local recommended dosage of phosphorus and potassium; the key growth periods of rice are: tillering stage, panicle initiation stage, stem elongation stage, heading stage, 20 days after heading and maturity stage.

Said management data includes land plots information, agricultural operation information, fertilization information and environmental information.

S2. Obtain accurate weather data for the predicted year;

According to the historical weather data of the past years of the region where the rice planting area to be determined is obtained in step S1 and the predicted year GFS (Global Forecasting System) weather data in this region, the climate annual type simulation system is used to obtain the accurate weather data in the predicted year;

The climate annual type simulation system includes a WRF (weather research & forecasting model) weather forecast model and a weather forecast model based on the LSTM (Long Short Term Memory) deep learning method. The WRF weather forecast model and the weather forecast model based on the LSTM deep learning method are both existing models and will not be described in detail in this application.

S2.1. Input the predicted year GFS weather data of the rice planting area to be determined obtained in step S1 into the WRY weather forecast model, and obtain the short-term accurate forecast weather data of the rice planting area to be determined in the next half month;

S2.2. Input the historical weather data of the region where the rice planting area to be determined in the past years into the weather forecast model based on deep learning methods such as LSTM, obtain the long-term forecast weather data, from the current month of the predicted year to December of the predicted year months, of the rice planting area to be determined;

S2.3. Input the short-term accurate forecast weather data obtained in step S2.1 into the weather forecast model based on LSTM and other deep learning methods in step S2.2; with the continuous update of GFS weather data in the predicted year, the long-term forecast weather data of the rice planting area based on LSTM and other deep learning method output by the weather forecast model is continuously accurate, so as to obtain the accurate forecast weather data in undetermined rice planting area in the next few months from the current month of the predicted year to December of the predicted year.

S3. 100 m×100 m plot-scale soil data preparation;

The soil properties of the soil data of the 100 m×100 m grid sampling points in the rice planting area to be determined are interpolated separately to obtain a 100 m×100 m soil property interpolation map, and then combined with the rice field vector layer to conduct regional analysis on each soil property interpolation map to obtain 100 m×100 m plot-scale soil property map; finally, the 100 m×100 m plots-scale soil data of the rice planting area to be determined is integrated and output.

The embodiment of the present invention respectively uses the Kriging interpolation tool and the regional analysis tool of the ArcGIS software to conduct interpolation operations and regional analysis processing.

S4. Localization of genetic parameters of rice growth model DSSAT model;

At least 3 years of nitrogen fertilizer gradient test data, rice variety information and management data of the rice planting area to be determined obtained in step S1, and the accurate forecast weather data for next few months from the current month of predicted year to December of predicted year of the rice planting area to be determined obtained in step S2 and the 100 m×100 m plot-scale soil data of the rice planting area to be determined obtained in step S3, are input into the existing DSSAT (Decision Support System For Agrotechnology Transfer) model; through DSSAT-GLUE and the trial-and-error method, the genetic parameters of the model are continuously adjusted to approach the measured values. The genetic parameters at this time are the localized genetic parameters, and the DSSAT model at this time is the localized model;

In the present invention, the coefficient of determination $R^2$, the normalized root mean square error nRMSE and the average error E between the agronomic parameters and the actual measured values are used as evaluation indicator, the agronomic parameters such as aboveground biomass, leaf area index, grain weight and chlorophyll content predicted by the model after adjusting the genetic parameters; until $R^2$ reaches more than 85% and nRMSE is less than 15%, the model parameter adjustment is completed and the model is localized. The average error E<0 or E>0 is used to judge whether the model underestimates or overestimates the above agronomic parameters;

$$E = \sum (yi - xi)/n$$

$$R^2 = \frac{\sum (y_i - \overline{y})^2}{\sum (x_i - \overline{y})^2}$$

$$nRMSE = 100 \times \frac{\sqrt{(1/n)\sum (y_i - x_i)^2}}{\sum x_i/n}$$

In the formula, $y_i$ is the predicted value of the agronomic parameter; $x_i$ is the actual measured value of the agronomic parameter; $\overline{y}$ is the average of the actual measured value $x_i$; n is the amount of samples participating in the calculation;

S5. Run the localized DSSAT model to predict plots-scale target yield and recommended nitrogen application amount;

Once again, the rice variety information and management data of the rice planting area to be determined obtained in step S1, the accurate forecast weather data of the next few months, from the current month of predicted year to in December of the predicted year, of the rice planting area to be determined obtained in step S2 and the 100 m×100 m plots-scale soil data of the rice planting area to be determined in step S3 are input into the localized DSSAT model in step S4, to obtain the potential yield prediction results of the rice planting area to be determined, 85% of the potential yield is the target yield of each plot; on this basis, the nitrogen application amount of the DSSAT model is adjusted through gradient until the nitrogen application amount increases but the potential yield no longer increases, the nitrogen fertilizer effect curve of each plot is established, and the corresponding nitrogen application amount under the target yield is further determined, that is recommended nitrogen application rates for each plot.

Embodiment—Take the Rice Planting Area of Chuangye Farm as an Example

Figure 2:
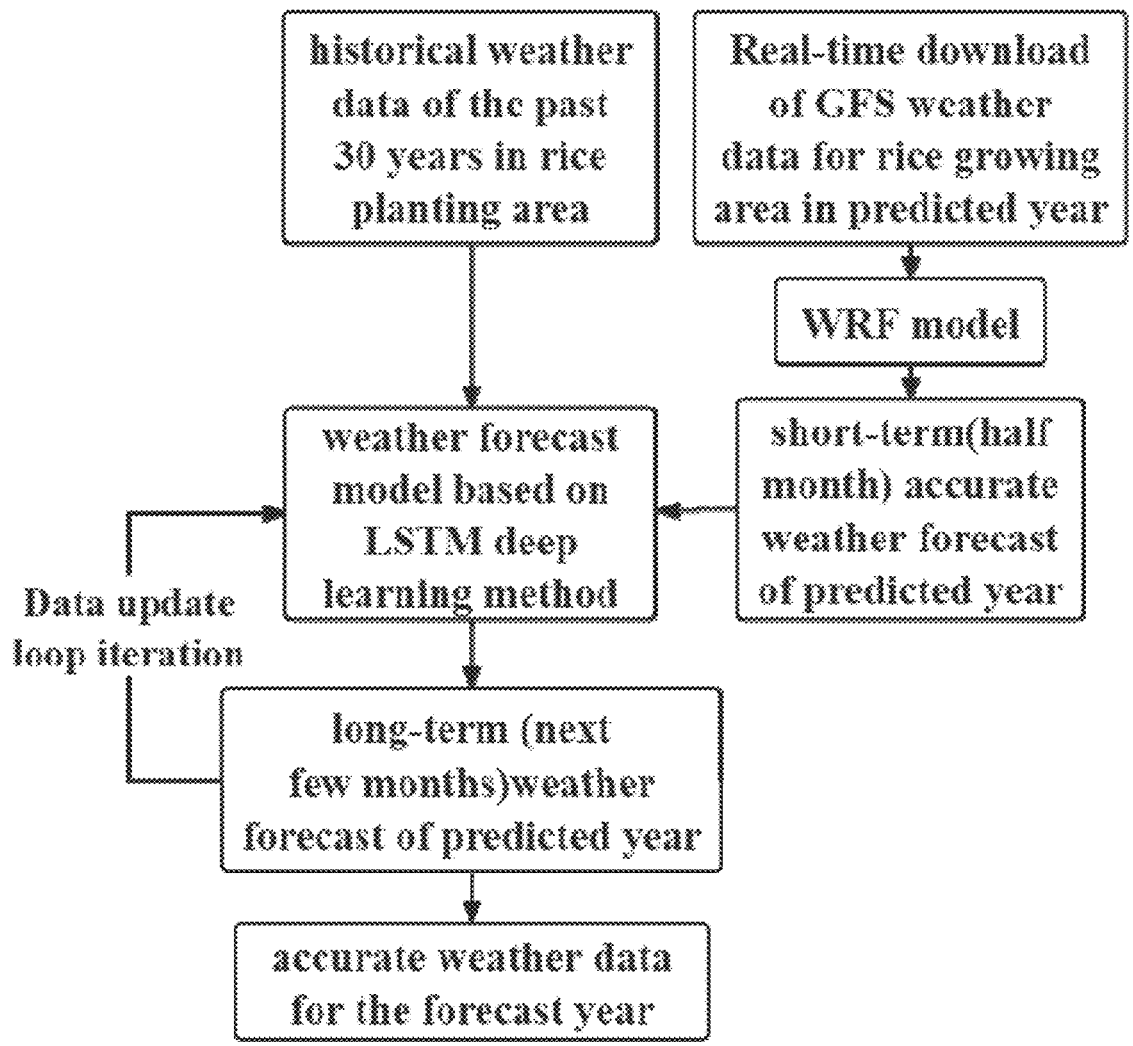
FIG. 2 is a functional structure diagram of the climate annual model simulation system according to the embodiment of the present invention.

As shown in FIG. 1, a determining method for rice target yield and nitrogen fertilizer dosage includes the following steps:

S1. basic database construction;

S1.1. Obtain the historical weather data of the Jiansanjiang Agricultural Reclamation Area of Heilongjiang Province for the past 30 years in region where the rice planting area of the Chuangye Farm is located, and obtain real-time GFS (Global Forecasting System) weather data of this area in the predicted year;

S1.2. Obtain the 100 m×100 m grid sampling point soil data and rice field vector layer in the rice planting area of the Chuangye Farm;

S1.3. Obtain at least 3 years of nitrogen fertilizer gradient test data, rice variety information and management data of each farmer in the rice planting area of the Chuangye Farm; in this example, in the nitrogen fertilizer gradient, N1=50 kg N/ha, N2=100 kg N/ha, N3=150 kgN/ha;

S2. Obtain accurate weather data for the predicted year; Based on the historical weather data of the Jiansanjiang Agricultural Reclamation Area in Heilongjiang Province in the past 30 years and the predicted year GFS weather data of the region obtained in step S1, the climate year type simulation system is used to obtain accurate weather data in the predicted year;

As shown in FIG. 2, particular process of obtaining accurate weather data for the predicted year is as follows:

S2.1. Input the predicted year GFS weather data of Jiansanjiang Agricultural Reclamation Area in Heilongjiang Province, which is obtained in step S1, into the WRF weather forecast model, to obtain the short-term accurate forecast weather data in the next half month of the rice planting area of the Chuangye Farm;

S2.2. Input the historical weather data of the Jiansanjiang Agricultural Reclamation Area in Heilongjiang Province over the past 30 years into a weather forecast model based on LSTM and other deep learning methods, to obtain the long-term forecast weather data of next few months of the Chuangye Farm from the current month of the predicted year to December of the predicted year;

S2.3. Input the short-term accurate forecast weather data obtained in step S2.1 into the weather forecast model based on deep learning methods of LSTM and other in step S2.2, with the continuous update of GFS weather data in the predicted year, the long-term forecast weather data of the rice planting area of the Chuangye Farm output by the weather forecast model of deep learning based on LSTM and other the method is continuously accurate, so as to obtain the accurate forecast weather data in the next few months of the rice planting area of the Chuangye Farm from the current month of the predicted year to December of the predicted year.

Figure 3A:
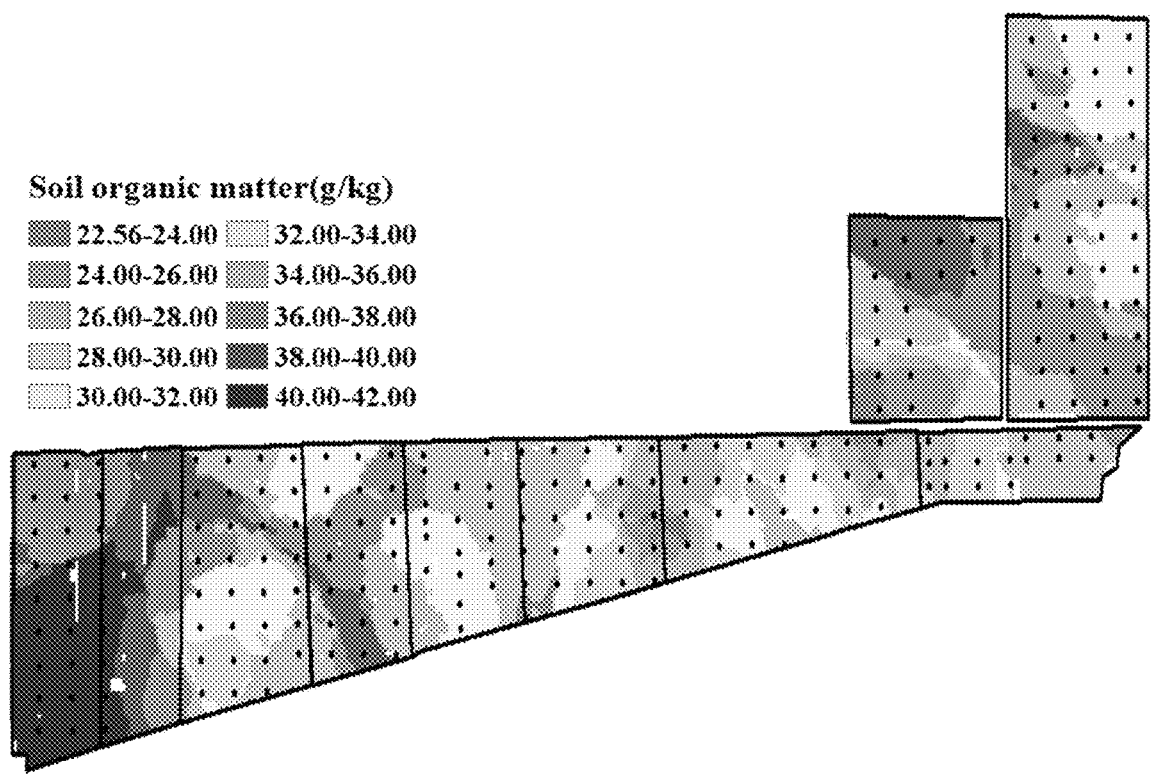
FIG. 3 a is the 100 m×100 m soil properties (soil organic matter) interpolation diagram map of the embodiment of the present invention.
FIG. 3b is a 100 m×100 m plot scale soil property (soil organic matter) diagram map according to an embodiment of the present invention.
Figure 3B:
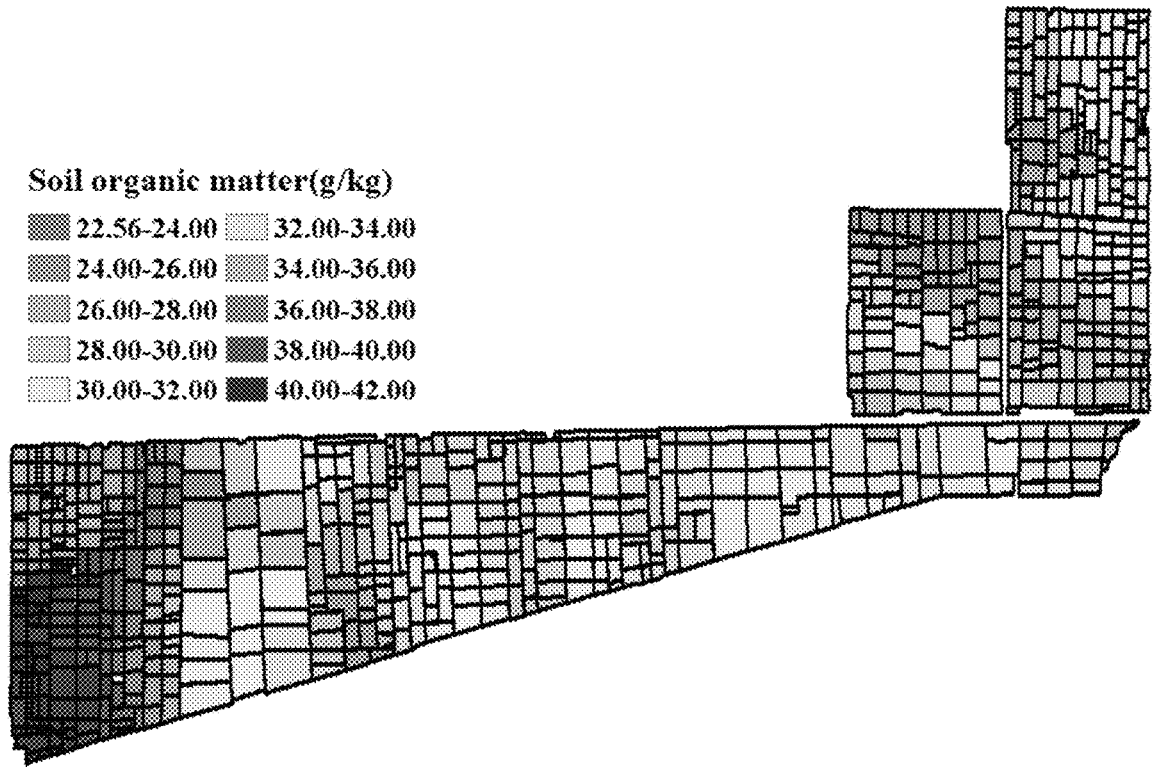

S3. 100 m×100 m plot-scale soil data preparation; Import the soil data of the 100 m×100 m grid sampling points and the vector layer of the rice field of the Chuangye Farm into ArcGIS software, and use Kriging interpolation tool in the software to interpolate each soil index of the rice field of the Chuangye Farm to obtain the 100 m×100 m soil interpolation map (take soil organic matter as an example, as shown in FIG. 3a), then use the regional analysis tool in the software to process each interpolation map to obtain a 100 m×100 m plot-scale soil map (take soil organic matter as an example, as shown in FIG. 3b), and finally integrated and output to obtain 100 m×100 m plot-scale soil data.

S4. Localization of genetic parameters of rice growth model DSSAT model; Input data of the Chuangye Farm as follow: the 100 m×100 m plot-scale soil, at least 3 years of nitrogen gradient test data, rice variety information &management data, and predicted year weather data into the DSSAT model, continuously adjust the genetic parameters of the model through DSSAT-GLUE and trial-and-error methods. The coefficient of determination $R^2$, the normalized root mean square error nRMSE and the average error E between the agronomic parameters (such as aboveground biomass, leaf area index, grain weight and chlorophyll content) predicted by the model after adjusting the genetic parameters and the actual measured values are used as evaluation indicators, until $R^2$ reaches more than 85% and nRMSE is less than 15%, the model parameter adjustment is completed and the model is localized. Wherein, the average error E<0 or E>0 is used to judge whether the model underestimates or overestimates the above agronomic parameters. The genetic parameters at this time are the localized genetic parameters, and the DSSAT model at this time is the localized model.

Figure 4:
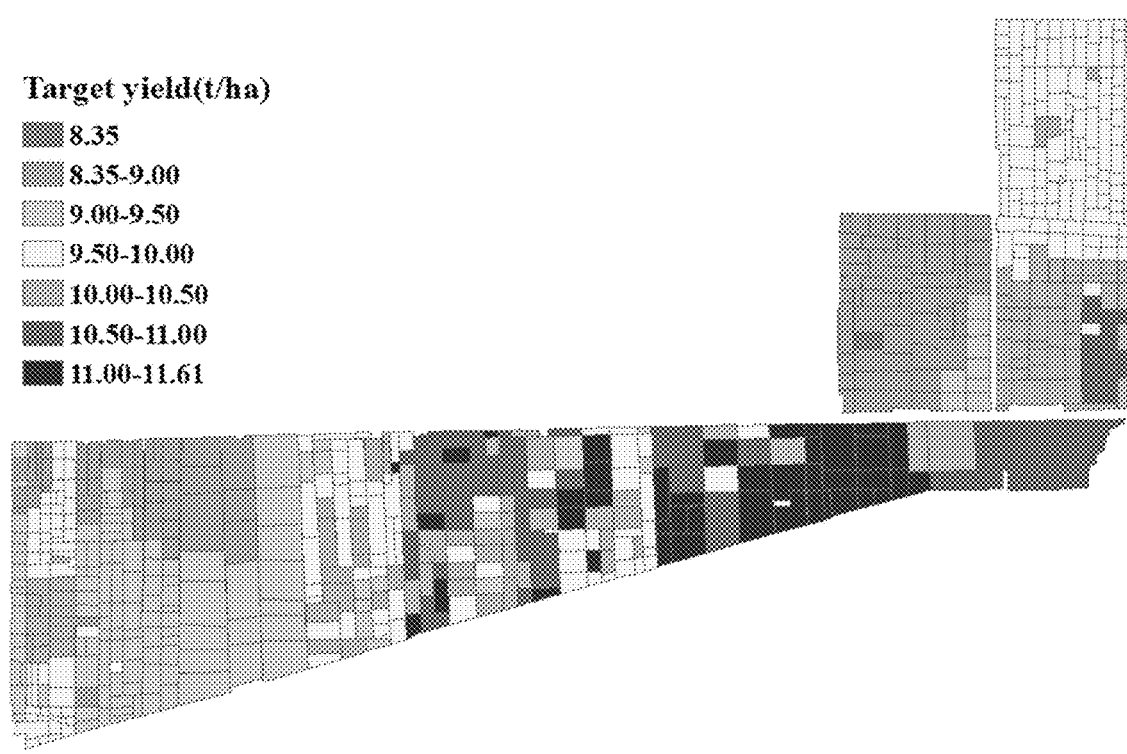
FIG. 4 is a plot-scale target yield map.
Figure 5:
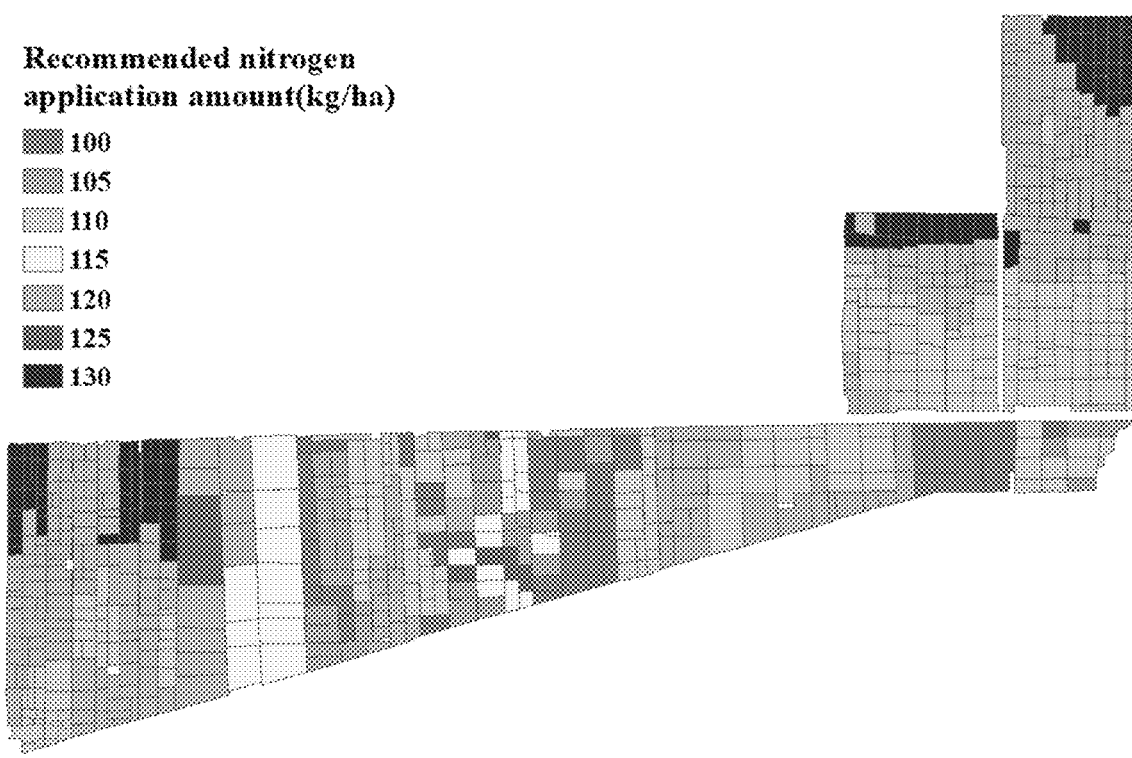
FIG. 5 shows the plot-scale nitrogen fertilizer recommendation results map.

S5. Run the localized DSSAT model to predict plot-scale target yield and recommended nitrogen application amount; Input the predicted year weather data obtained in step S2, the 100 m×100 m plot-scale soil data set obtained in step S3, as well as the rice variety information and management data into the localized DSSAT model in step S4, and run it to obtain the potential yield prediction results of the Chuangye Farm rice fields. 85% of the potential yield is the target yield of each plot; on this basis, the nitrogen application amount of the DSSAT model is gradient adjusted until the nitrogen application amount increases but the potential yield no longer increases; accordingly, the nitrogen fertilizer effect curve of each plot is established, and further determine the corresponding nitrogen application amount under the target yield, which is the recommended nitrogen application amount for each plot (the results are shown in FIG. 4 and FIG. 5).

The invention claimed is:

1. A soil-climate intelligent determining method for rice target yield and nitrogen fertilizer amount, comprising following steps:

S1. constructing a database, comprising

S1.1. obtaining historical weather data from a region where a rice planting area is to be determined over past years, and obtaining real-time GFS weather data for the region in a predicted year;

wherein said weather data includes daily maximum temperature, daily minimum temperature, daily sunshine hours, daily precipitation, humidity, wind direction and cloud thickness;

S1.2. obtaining soil data of a 100 m×100 m grid sampling points and a rice field vector layer in the rice planting area to be determined;

wherein said soil data includes soil pH, soil organic matter, soil total nitrogen content, soil available phosphorus, soil available potassium, soil bulk density, soil texture, soil moisture, soil cation exchange capacity, soil nitrate nitrogen and soil ammonium nitrogen;

S1.3. obtaining at least three years of nitrogen fertilizer gradient test data, rice variety information and management data for each farmer in each year in the rice planting area to be determined;

wherein said nitrogen fertilizer gradient test data includes flowering period, maturity period time and yield of rice under different nitrogen fertilizer amount gradients, as well as aboveground biomass, leaf area index, grain weight, chlorophyll content under different nitrogen fertilizer amount gradients and during critical growth period of rice; wherein the nitrogen fertilizer gradients being no nitrogen application, 50% of the local recommended nitrogen application, local recommended nitrogen application and 150% of the local recommended nitrogen application are recorded as N0, N1, N2, and N3. respectively;

wherein said key growth stages of rice are: tillering stage, panicle initiation stage, stem elongation stage, heading stage, 20 days after heading and maturity stage;

said management data includes plots information, agricultural operation information, fertilization information and environmental information;

S2. obtaining accurate weather data in the predicted year, comprising:

according to the historical weather data of the past years in the region where the rice planting area to be determined is located and the predicted year GFS weather data of the rice planting area obtained in step S1, using a climate year simulation system to obtain accurate weather data in the predicted year;

wherein said climate year simulation system includes a WRF weather forecast model and a weather forecast model based on LSTM deep learning method;

S3. Preparing 100 m×100 m plot-scale soil data, comprising:

Interpolating each soil property of the soil data of the 100 m×100 m grid sampling point in the rice planting area separately to obtain a 100 m×100 m soil property interpolation map, with combining the rice field vector layer to conduct regional analysis and processing each soil property interpolation map to obtain 100 m×100 m plot-scale soil property map; finally, integrating and outputting the 100 m×100 m plot-scale soil data of the rice planting area;

S4. localizing genetic parameters of rice growth model DSSAT model, comprising:

inputting at least 3 years of nitrogen fertilizer gradient test data, rice variety information and management data of the rice planting area to be determined obtained in step S1, next few months accurate forecast weather data from the current month of the predicted year to December of the predicted year of the rice planting area to be determined obtained in step S2 and the 100 m×100 m plot-scale soil data of the rice planting area to be determined obtained in step S3 into the DSSAT model, and continuously adjusting the genetic parameters of the model to approach to actual measured values through DSSAT-GLUE and trial-and-error method, wherein the genetic parameters at this time are localized genetic parameters, and the DSSAT model at this time is a localized model;

S5. running the localized DSSAT model to predict plot-scale target yield and recommended nitrogen application amount, comprising:

inputting the rice variety information and management data of the rice planting area to be determined obtained in step S1, the accurate forecast weather data for the next few months of the rice planting area to be determined obtained in step S2 from the current month of the forecast year to December of the forecast year and the 100 m×100 m plot-scale soil data of the rice planting area to be determined obtained in step S3 into the localized DSSAT model in step S4 to obtain potential yield prediction results of the rice planting area to be determined; 85% of the potential yield is the target yield of each plot; adjusting a nitrogen application rate of the DSSAT model until the nitrogen application amount increases and the potential yield no longer increases; establishing a nitrogen fertilizer effect curve of each plot, further determining a corresponding nitrogen application amount under a target output, the corresponding nitrogen application amount is the recommended nitrogen application amount for each plot;

S6. determining rice target yield and recommended nitrogen application amount of the rice planting area of Chuangye Farm at Heilongjiang Province of P. R. China, wherein the recommended nitrogen application amount for each plot of Chuangye Farm is shown in FIGS. 4 and 5.

2. The method according to claim 1, wherein said step S2 further comprises:

S2.1. inputting the predicted year GFS weather data of the rice planting area to be determined obtained in step S1 into the WRF weather forecast model to obtain short-term accurate forecast weather data for a next half month of the rice planting area to be determined;

S2.2. inputting the historical weather data of the region where the rice planting area to be determined is located in the past years into the weather forecast model based on deep learning methods, and obtain long-term forecast weather data in next months from the current month of the predicted year to December of the predicted year of the rice planting area to be determined;

S2.3. inputting the short-term accurate forecast weather data obtained in step S2.1 into the weather forecast model based on deep learning methods, continuously updating the GFS weather data in the predicted year, the long-term forecast weather data of the rice planting area to be determined output from weather forecast models based on deep learning methods is continuously accurate, thereby obtaining accurate forecast weather data for the next few months from the current month of the prediction year to December of the prediction year for the rice planting area to be determined.

3. The method according to claim 1, wherein, in the step S3, Kriging interpolation tool and regional analysis tool of ArcGIS software are respectively used to conduct interpolation operation and regional analysis processing.

4. The method according to claim 1, wherein, in the step S4, coefficient of determination $R^2$, the normalized root mean square error nRMSE and the average error E between agronomic parameters of the above-ground biomass, leaf area index, grain weight and chlorophyll content predicted by the model after adjusting the genetic parameters and the actual measured values are used as evaluation indicators, until $R^2$ reaches more than 85%, and nRMSE is less than 15%, the model parameter adjustment is completed and the model localization is achieved, wherein the average error E<0 or E>0 is used to judge whether the model underestimates or overestimates the above agronomic parameters;

$$E = \sum (y_i - x_i)/n$$

$$R^2 = \frac{\sum (y_i - \bar{y})^2}{\sum (x_i - \bar{y})^2}$$

$$nRMSE = 100 \times \frac{\sqrt{(1/n)\sum (y_i - x_i)^2}}{\sum x_i/n}$$

wherein in the formula, yi is the predicted value of agronomic parameters; xi is the actual measured value of agronomic parameters; is the average value of the actual measured values xi; n is the number of samples participate in the calculation.

* * * * *